(12) United States Patent
Nishihara et al.

(10) Patent No.: US 6,469,395 B1
(45) Date of Patent: Oct. 22, 2002

(54) SEMICONDUCTOR DEVICE

(75) Inventors: Tatsuto Nishihara; Masatoshi Yasunaga, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/567,009

(22) Filed: May 9, 2000

(30) Foreign Application Priority Data

Nov. 25, 1999  (JP) ............................................. 11-334190

(51) Int. Cl.[7] ........................ H01L 23/48; H01L 23/52; H01L 29/40
(52) U.S. Cl. ........................ 257/781; 257/737; 257/777
(58) Field of Search ................................. 257/777, 778, 257/780, 737, 738, 781, 686, 776

(56) References Cited

U.S. PATENT DOCUMENTS

| 5,521,435 | A | * | 5/1996 | Mizukoshi | 257/698 |
|---|---|---|---|---|---|
| 5,739,581 | A | * | 4/1998 | Chillara et al. | 257/668 |
| 5,783,870 | A | * | 7/1998 | Mostafazadeh et al. | 257/791 |
| 5,808,878 | A | * | 9/1998 | Saito et al. | 361/818 |
| 5,977,640 | A | * | 11/1999 | Betin et al. | 257/777 |
| 6,028,365 | A | * | 2/2000 | Akram et al. | 257/778 |
| 6,140,707 | A | * | 10/2000 | Plepys et al. | 257/778 |

FOREIGN PATENT DOCUMENTS

| EP | 0892434 A2 | 1/1999 |
|---|---|---|
| JP | 5-275611 | 10/1993 |
| JP | 5-326834 | 12/1993 |

* cited by examiner

*Primary Examiner*—Elvin Enad
*Assistant Examiner*—Kyung S. Lee
(74) *Attorney, Agent, or Firm*—McDermott, Will & Emery

(57) ABSTRACT

A semiconductor device has a first semiconductor chip $2a$, a wiring substrate 1 connected to the first semiconductor chip $2a$, a first surrounding substrate $6a$ which has an opening at a position avoiding the first semiconductor chip $2a$ and which is connected onto the wiring substrate 1 by flip-chip bonding, and a second semiconductor chip $2b$ connected onto the first surrounding substrate $2a$ by flip-chip bonding. A second surrounding substrate $6b$ comprising a two or more number of substrate elements is used for the first surrounding substrate $6a$.

8 Claims, 3 Drawing Sheets

SEMICONDUCTOR DEVICE

BACKGROUND OF THE INVENTION

1. Field of the Invention

The present invention relates to a packaging structure for a semiconductor device. In particular, it relates to a semiconductor device having reduced outer dimensions and containing a plurality of semiconductor chips.

2. Discussion of Background

A conventional semiconductor device has such a packaging structure that a semiconductor chip is attached onto a wiring substrate by die bonding; the semiconductor chip is connected to the wiring substrate by wire bonding, and the semiconductor chip and wires are covered with a molded resin.

The conventional packaging structure had such a problem that the outer dimensions became large when a plurality of semiconductor chips were to be contained. The present invention aims at solving the abovementioned problem and to provide a semiconductor device capable of reducing the outer dimensions while a plurality of semiconductor chips are contained.

SUMMARY OF THE INVENTION

In accordance with a first aspect of the present invention, there is provided a semiconductor device which comprises:

a first semiconductor chip, a wiring substrate connected to the first semiconductor chip, a first surrounding substrate which has an opening at a position avoiding the first semiconductor chip and which is connected onto the wiring substrate by flip-chip bonding, and a second semiconductor chip connected onto the first surrounding substrate by flip-chip bonding.

In accordance with a second aspect of the present invention, there is provided a semiconductor device which comprises:

a first semiconductor chip, a wiring substrate connected to the first semiconductor chip, a second surrounding substrate comprising a two or more number of substrate elements which are arranged around the first semiconductor chip and which are connected onto the wiring substrate by flip-chip bonding, and a second semiconductor chip connected onto the second surrounding substrate by flip-chip bonding.

According to a third aspect of the present invention, there is provided a semiconductor device according to the first or second aspect wherein the first semiconductor chip is electrically connected to the wiring substrate by flip-chip bonding.

According to a fourth aspect of the present invention, there is provided a semiconductor device according to the first or second aspect, wherein the first semiconductor chip is die-bonded to the wiring substrate and is electrically connected to the wiring substrate with wires.

According to a fifth aspect of the present invention, there is provided a semiconductor device according to the first aspect of the invention wherein the first semiconductor chip is die-bonded to the wiring substrate and is connected to the first surrounding substrate with wires.

According to a sixth aspect of the present invention, there is provided a semiconductor device according to the second aspect of the present invention, wherein the first semiconductor chip is die-bonded to the wiring substrate and is connected to the second surrounding substrate with wires.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
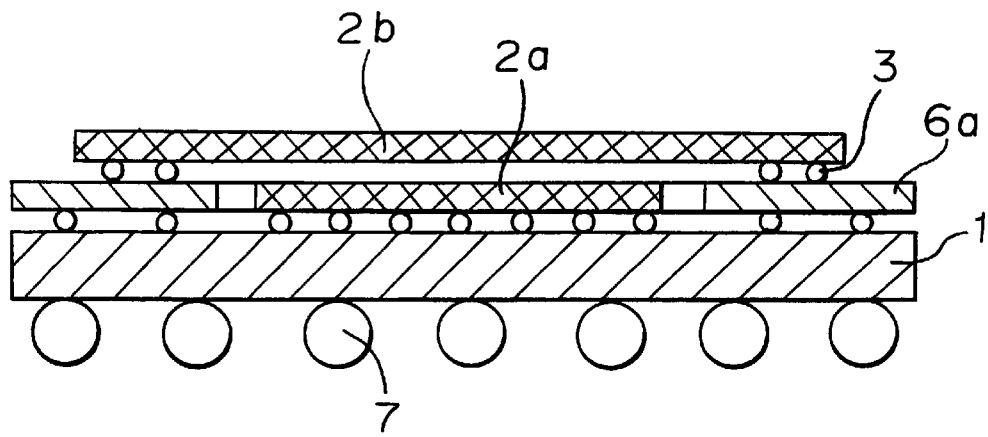
FIG. 1 is a diagramatical cross-sectional view of the semiconductor device according to a first embodiment of the present invention.

Preferred embodiments of the present invention will be described in more detail with reference to FIGS. 1 to 6 wherein the same reference numerals designate the same or corresponding parts.

Embodiment 1

A first embodiment of the present invention will be described with reference to FIG. 1.

A wiring substrate 1 has a circuit pattern. A semiconductor chip 2a having a surface on which bumps 3 are arranged is connected to the circuit pattern of the wiring substrate 1 by flip-chip bonding. A first surrounding substrate 6a has an opening at its central portion, wherein the opening is sufficient to accommodate the semiconductor chip 2a. The first surrounding substrate 6a has a circuit pattern, and bumps 3 are arranged on the surface where the circuit pattern is formed. The first surrounding substrate 6a is connected electrically to the circuit pattern of the wiring substrate 1 by flip-chip bonding wherein the semiconductor chip 2a, attached onto the wiring substrate 1, is received in the opening formed in the first surrounding substrate 6a.

Then, a second semiconductor chip 2b having a surface on which bumps 3 are arranged is placed on the first surrounding substrate 6a and is connected to the circuit pattern of the first surrounding substrate 6a by flip-chip bonding. The second semiconductor chip 2b is adapted to connect electrically the circuit pattern of the wiring substrate 1 through the circuit pattern of the first surrounding substrate 6a. Then, external terminals 7 such as solder balls are formed for external connection on a rear surface of the wiring substrate 1.

As described above, in the semiconductor device of Embodiment 1, the first semiconductor chip 2a and the first surrounding substrate 6a surrounding the first semiconductor chip 2a are connected to the wiring substrate 1, and the second semiconductor chip 2b is connected to the wiring substrate 1 through the first surrounding substrate 6a. Accordingly, memory chips having different memory capacities can be included in the same and single package, and semiconductor devices having a variety of memory capacities can easily be manufactured. This is because the semiconductor chips 2a 2b can respectively be connected easily to the wiring substrate 1 by using the first surrounding substrate 6a.

In Embodiment 1, a case that the second semiconductor chip 2b is electrically connected to the circuit pattern of the wiring substrate 1 through the circuit pattern of the first surrounding substrate 6a is described. However, the same effect as in this embodiment can be achieved even by connecting the semiconductor chip 2a to the semiconductor chip 2b through the circuit pattern of the first surrounding substrate 6a.

With respect to Embodiment 1, description has been made as to a case of using a single semiconductor chip received in the opening of the first surrounding substrate 6a. However, the same effect as in this embodiment can be achieved even by using a plurality of semiconductor chips received in the opening of the first surrounding substrate 6a.

Further, two semiconductor chips are used in Embodiment 1. However, the number of semiconductor chips may be increased by increasing the number of the first surrounding substrate 6a each receiving therein a semiconductor chip or chips. In this case too, the same effect is obtainable.

Embodiment 2

Figure 2:
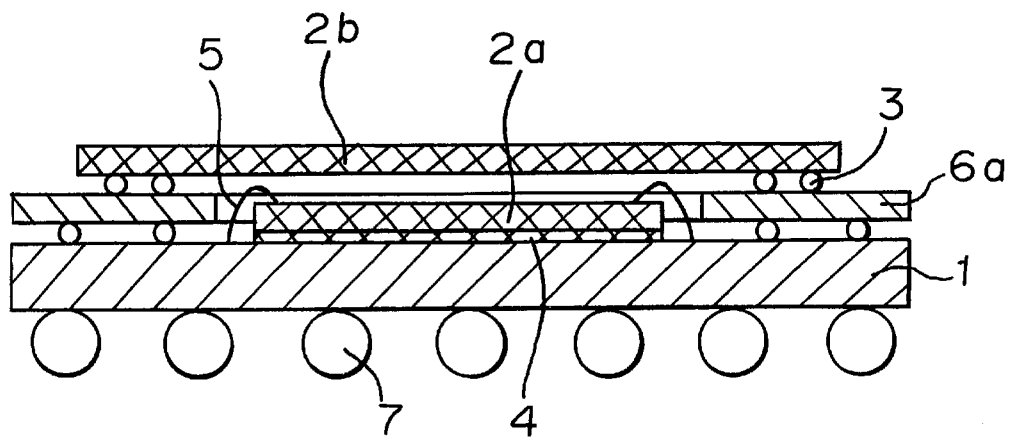
FIG. 2 is a diagramatical cross-sectional view of the semiconductor device according to a second embodiment of the present invention.

A second embodiment of the present invention will be described with reference to FIG. 2. In FIG. 2, a wiring substrate 1 has a circuit pattern. A first semiconductor chip 2a is die-bonded to the wiring substrate 1 by using a die-bonding material 4 such as solder or resin, and electrodes of the first semiconductor chip 2a are connected to the circuit pattern of the wiring substrate 1 with wires 5. Then, a first surrounding substrate 6a is connected to the wiring substrate 1 by flip-chip bonding, and a second semiconductor chip 2b is connected to the surrounding substrate 6a by flip-chip bonding in the same manner as in Embodiment 1.

As described above, in the semiconductor device of Embodiment 2, the first semiconductor chip 2a and the first surrounding substrate 6a surrounding the first semiconductor chip 2a are connected to the wiring substrate 1, and the second semiconductor chip 2b is connected to the wiring substrate 1 through the first surrounding substrate 6a. Accordingly, memory chips having different memory capacities can be included in the same and single package, and semiconductor devices having a variety of memory capacities can easily be manufactured. This is because the semiconductor chips 2a 2b can respectively be connected easily to the wiring substrate 1 by using the first surrounding substrate 6a.

In Embodiment 2, a case that the second semiconductor chip 2b is electrically connected to the circuit pattern of the wiring substrate 1 through the circuit pattern of the first surrounding substrate 6a is described. However, the same effect as in this embodiment can be achieved even by connecting the semiconductor chip 2a to the semiconductor chip 2b through the circuit patter of the first surrounding substrate 6a.

With respect to Embodiment 2, description has been made as to a case of using a single semiconductor chip received in the opening of the first surrounding substrate 6a. However, the same effect as in this embodiment can be achieved even by using a plurality of semiconductor chips received in the opening of the first surrounding substrate 6a.

Further, two semiconductor chips are used in Embodiment 2. However, the number of semiconductor chips may be increased by increasing the number of the first surrounding substrate 6a each receiving therein a semiconductor chip or chips. In this case too, the same effect is obtainable.

Figure 3:
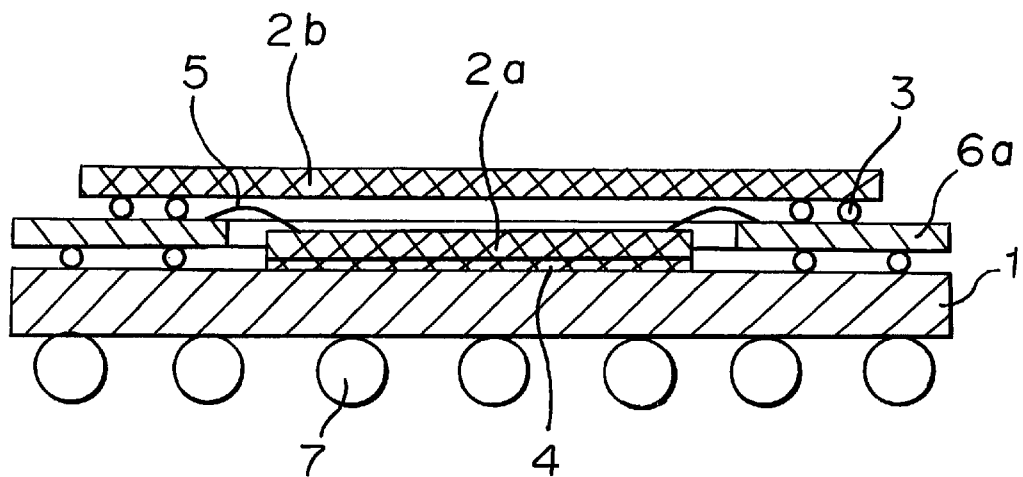
FIG. 3 is a diagramatical cross-sectional view of the semiconductor device according to a third embodiment of the present invention.

A third embodiment of the present invention will be described with reference to FIG. 3. In FIG. 3, a wiring substrate 1 has a circuit pattern. A first semiconductor chip 2a is die-bonded to the wiring substrate 1 by using a die-bonding material 4 such as solder or resin. A first surrounding substrate 6a has an opening at its central portion, wherein the opening is sufficient to accommodate the semiconductor chip 2a. The first surrounding substrate 6a has a circuit pattern, and bumps 3 are arrange on the surface where the circuit pattern is formed. The first surrounding substrate 6a is connected to the circuit pattern of the wiring substrate 1 by flip-chip bonding wherein the semiconductor chip 2a, attached onto the wiring substrate 1, is received in the opening formed in the first surrounding substrate 6a. Then, electrodes of the first semiconductor chip 2a are connected to the circuit pattern of the surrounding substrate 6a with wires 5, and a second semiconductor chip 2b is connected to the surrounding substrate 6a by flip-chip bonding in the same manner as in Embodiment 1.

As described above, in the semiconductor device of Embodiment 3, the first semiconductor chip 2a and the first surrounding substrate 6a surrounding the first semiconductor chip 2a are connected to the wiring substrate 1, and the second semiconductor chip 2b is connected to the wiring substrate 1 through the first surrounding substrate 6a. Accordingly, memory chips having different memory capacities can be included in the same and single package, and semiconductor devices having a variety of memory capacities can easily be manufactured. This is because the semiconductor chips 2a 2b can respectively be connected easily to the wiring substrate 1 by using the first surrounding substrate 6a.

In Embodiment 3, a case that the second semiconductor chip 2b is electrically connected to the circuit pattern of the wiring substrate 1 through the circuit pattern of the first surrounding substrate 6a is described. However, the same effect as in this embodiment can be achieved even by connecting the semiconductor chip 2a to the semiconductor chip 2b through the circuit patter of the first surrounding substrate 6a.

With respect to Embodiment 3, description has been made as to a case of using a single semiconductor chip received in the opening of the first surrounding substrate 6a. However, the same effect as in this embodiment can be achieved even by using a plurality of semiconductor chips received in the opening of the first surrounding substrate 6a.

Further, two semiconductor chips are used in Embodiment 3. However, the number of semiconductor chips may be increased by increasing the number of the first surrounding substrate 6a each receiving therein a semiconductor chip or chips. In this case too, the same effect is obtainable.

Figure 4:
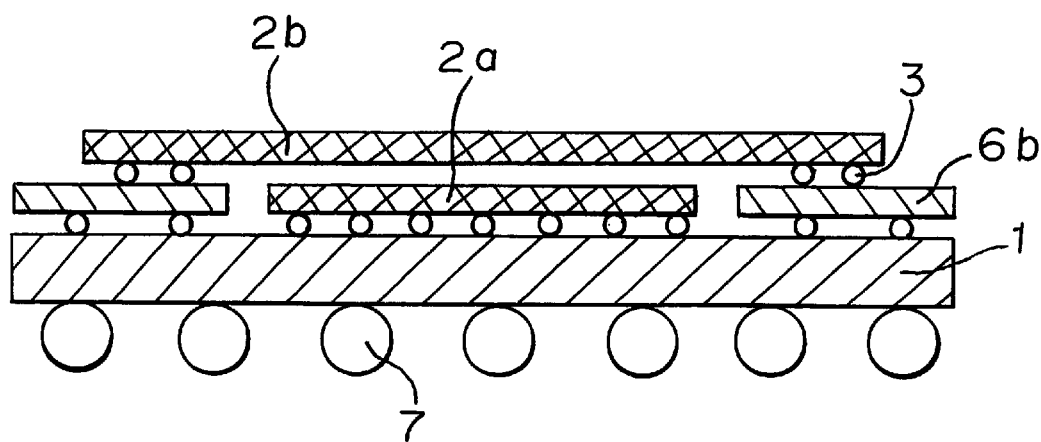
FIG. 4 is a diagramatical cross-sectional view of the semiconductor device according to a fourth embodiment of the present invention.

A fourth embodiment of the present invention will be described with reference to FIG. 4. In this embodiment, instead of using the first surrounding substrate 6a having a larger opening than the semiconductor chip 2a at its central portion as shown in FIG. 1, a second surrounding substrate 6b which comprises a two or more number of substrate elements each having a rectangular shape and smaller dimensions than those of the first surrounding substrate 6a, is arranged around the first semiconductor chip 2a. The other construction is the same as that of Embodiment 1. The fourth embodiment performs the same effect as the first embodiment.

Figure 5:
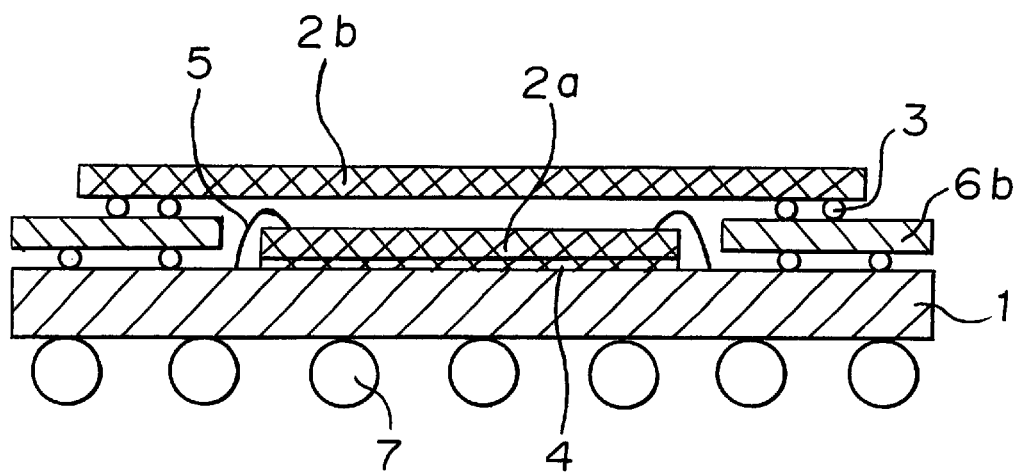
FIG. 5 is a diagramatical cross-sectional view of the semiconductor device according to a fifth embodiment of the present invention.

A fifth embodiment of the present invention will be described with reference to FIG. 5. In this embodiment, instead of using the first surrounding substrate 6a having a larger opening than the semiconductor chip 2a at its central portion as shown in FIG. 2, a second surrounding substrate 6b which comprises a two or more number of substrate elements each having a rectangular shape and smaller dimensions than those of the first surrounding substrate 6a, is arranged around the first semiconductor chip 2a. The other construction is the same as that of first embodiment. The fourth embodiment performs the same effect as the first embodiment.

Figure 6:
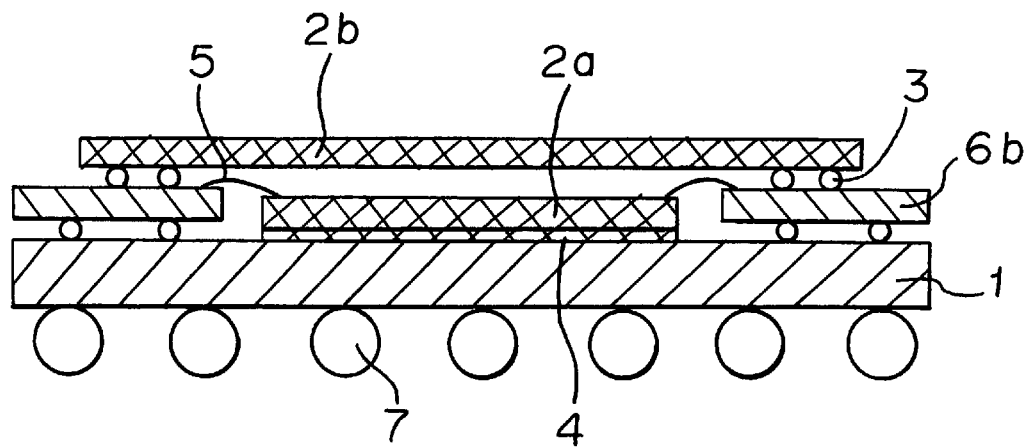
FIG. 6 is a diagramatical cross-sectional view of the semiconductor device according to a sixth embodiment of the present invention.

A sixth embodiment of the present invention will be described with reference to FIG. 6. In this embodiment, instead of using the first surrounding substrate 6a having a larger opening than the semiconductor chip 2a at its central portion as shown in FIG. 3, a second surrounding substrate 6b which comprises a two or more number of substrate elements each having a rectangular shape and smaller dimensions than those of the first surrounding substrate 6a, is arranged around the first semiconductor chip 2a. The other construction is the same as that of first embodiment. The fourth embodiment performs the same effect as the first embodiment.

The inventions having the constructions described above perform the functions and effects as follows.

In the inventions according to the first, second, third, fourth and fifth aspects, a first semiconductor chip and a first or second surrounding substrate which surrounds the first semiconductor chip are connected to a wiring substrate, and a second semiconductor chip is connected to the wiring substrate through the first or second surrounding substrate. Accordingly, it is possible to contain memory chips having different memory capacities in a single package whereby a semiconductor device having various memory capacities can easily be obtained.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 11-334190 filed on Nov. 25, 1999 including specification, claims, drawings and summary are incorporated herein by reference in its entirety.

What is claimed is:

1. A semiconductor device which comprises:
   a first semiconductor chip,
   a wiring substrate connected to the first semiconductor chip,
   a first surrounding substrate which has an opening at a position avoiding the first semiconductor chip and which is connected onto the wiring substrate by flip-chip bonding, and
   a second semiconductor chip connected onto the first surrounding substrate by flip-chip bonding.

2. The semiconductor device according to claim 1, wherein the first semiconductor chip is electrically connected to the wiring substrate by flip-chip bonding.

3. The semiconductor device according to claim 1, wherein the first semiconductor chip is die-bonded to the wiring substrate and is electrically connected to the wiring substrate with wires.

4. The semiconductor device according to claim 1, wherein the first semiconductor chip is die-bonded to the wiring substrate and is connected to the first surrounding substrate with wires.

5. A semiconductor device which comprises:
   a first semiconductor chip,
   a wiring substrate connected to the first semiconductor chip,
   a second surrounding substrate comprising a two or more number of substrate elements which are arranged around the first semiconductor chip and which are connected onto the wiring substrate by flip-chip bonding, and
   a second semiconductor chip connected onto the second surrounding substrate by flip-chip bonding.

6. The semiconductor device according to claim 5, wherein the first semiconductor chip is electrically connected to the wiring substrate by flip-chip bonding.

7. The semiconductor device according to claim 5, wherein the first semiconductor chip is die-bonded to the wiring substrate and is electrically connected to the wiring substrate with wires.

8. The semiconductor device according to claim 5, wherein the first semiconductor chip is die-bonded to the wiring substrate and is connected to the second surrounding substrate with wires.

* * * * *